United States Patent
Tanishima

(10) Patent No.: US 7,372,740 B2
(45) Date of Patent: May 13, 2008

(54) SEMICONDUCTOR MEMORY DEVICE

(75) Inventor: Motoko Tanishima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/126,330

(22) Filed: May 11, 2005

(65) Prior Publication Data

US 2006/0126397 A1    Jun. 15, 2006

(30) Foreign Application Priority Data

Dec. 15, 2004    (JP)    ............................. 2004-363259

(51) Int. Cl.
*G11C 11/34*    (2006.01)
*G11C 16/04*    (2006.01)
(52) U.S. Cl. .............................. 365/185.29; 365/185.18
(58) Field of Classification Search ........... 365/185.29, 365/185.18
See application file for complete search history.

(56) References Cited

U.S. PATENT DOCUMENTS

| | | | | |
|---|---|---|---|---|
| 5,566,113 A | * | 10/1996 | Saito et al. ................. | 365/201 |
| 5,844,837 A | * | 12/1998 | Yoshikawa .................. | 365/156 |
| 6,108,232 A | * | 8/2000 | Hennebois et al. ......... | 365/154 |
| 6,137,720 A | * | 10/2000 | Lancaster .............. | 365/185.11 |
| 6,906,961 B2 | * | 6/2005 | Eggleston et al. ..... | 365/185.29 |
| 2003/0145151 A1 | | 7/2003 | Matsushita | |

FOREIGN PATENT DOCUMENTS

JP    05012889    1/1993

\* cited by examiner

*Primary Examiner*—Huan Hoang
*Assistant Examiner*—Kretelia Graham
(74) *Attorney, Agent, or Firm*—Arent Fox LLP

(57) ABSTRACT

Based on a continuous erase start signal outputted, in response to an inputted continuous erase command, from a continuous erase control circuit, a shift circuit outputs a control signal for giving instructions to execute respective data erase operation to a plurality of non-volatile memory circuits sequentially, and when the data erase operation in all of the non-volatile memory circuits has been completed, the shift circuit outputs a continuous erase completion signal. Thereby, the data erase operation in all of the non-volatile memory circuits built in one chip can be continuously executed by one continuous erase command as is also the case where a single non-volatile memory circuit is built in.

13 Claims, 9 Drawing Sheets

F I G. 1
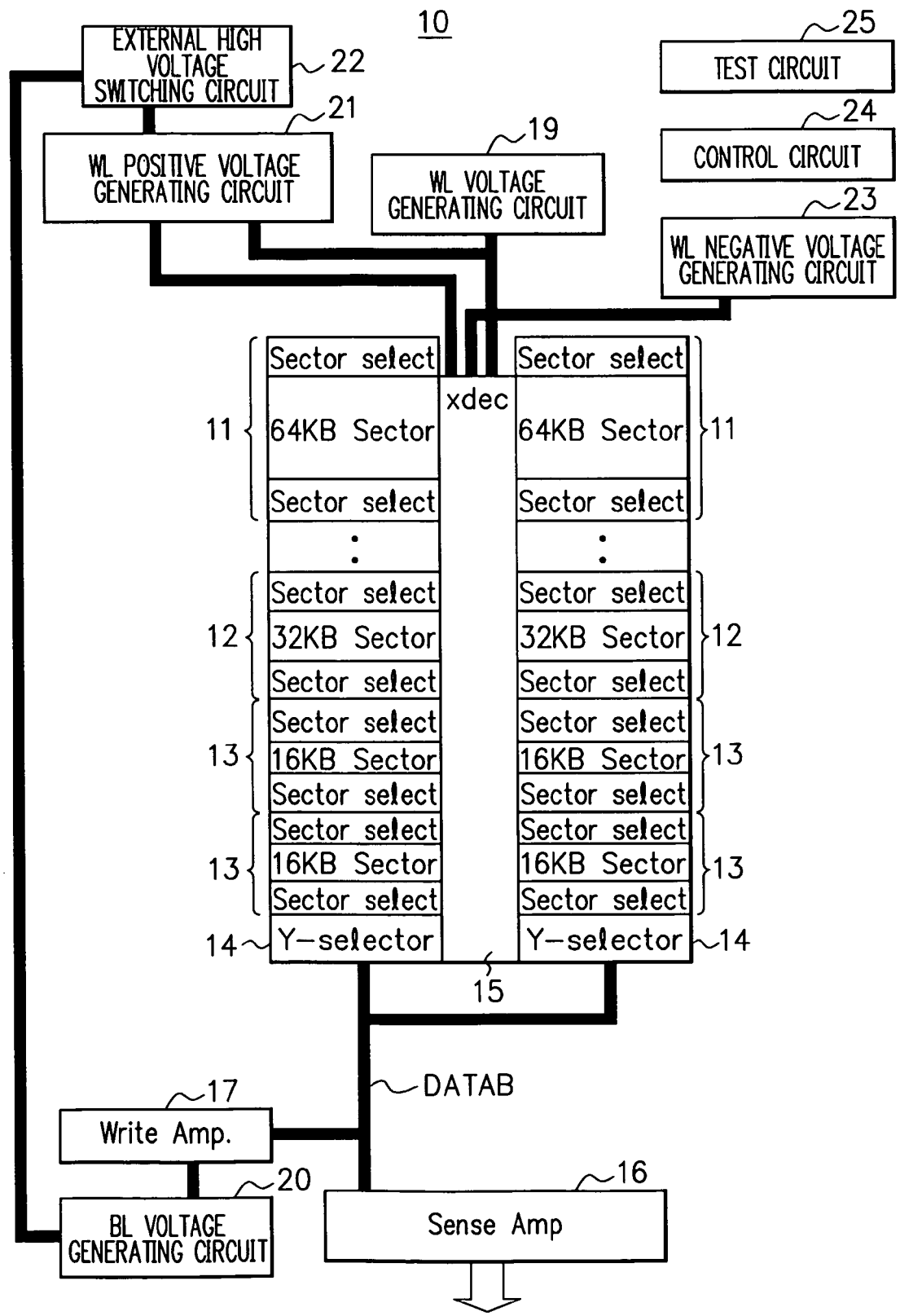

F I G. 2
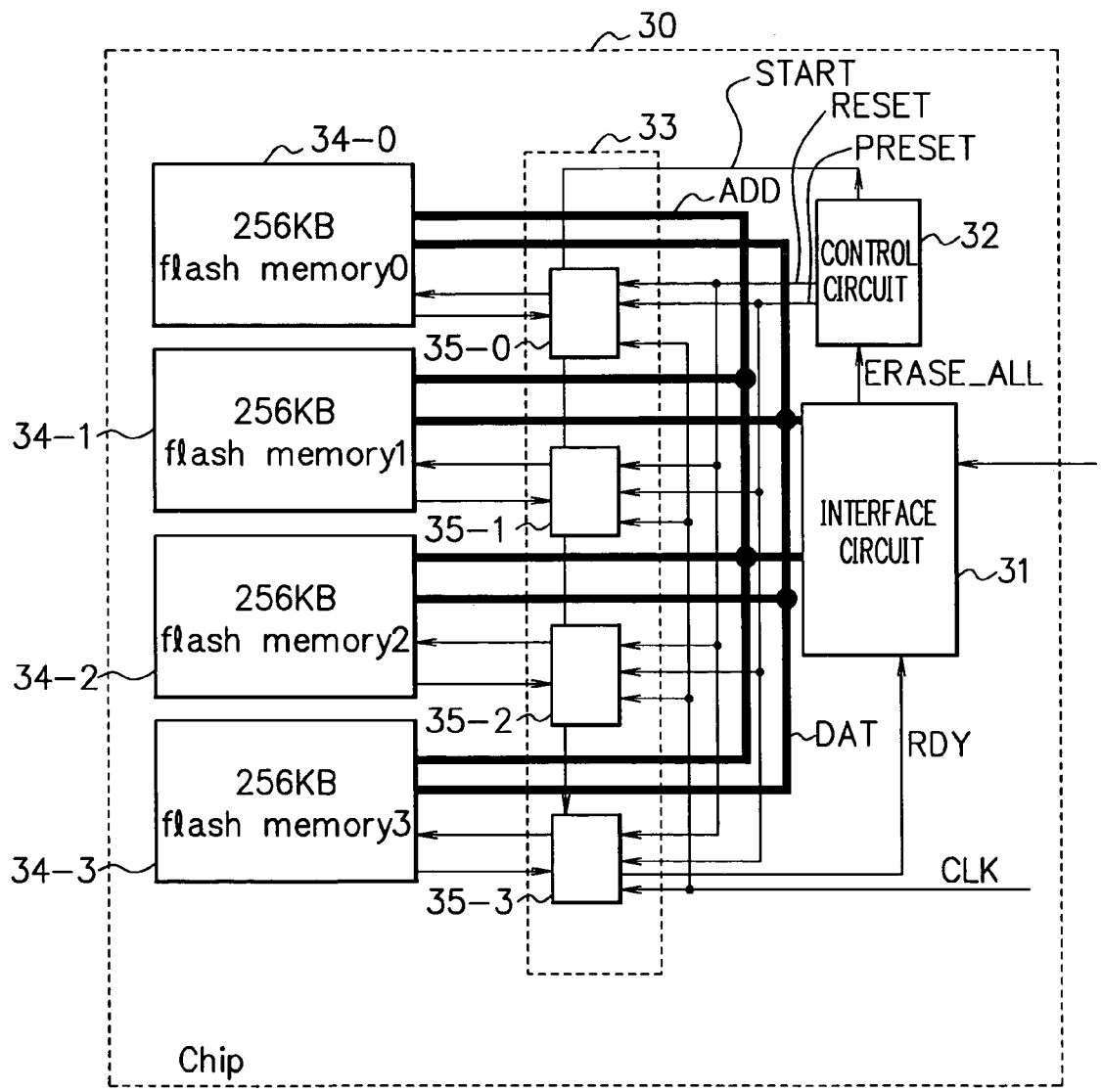

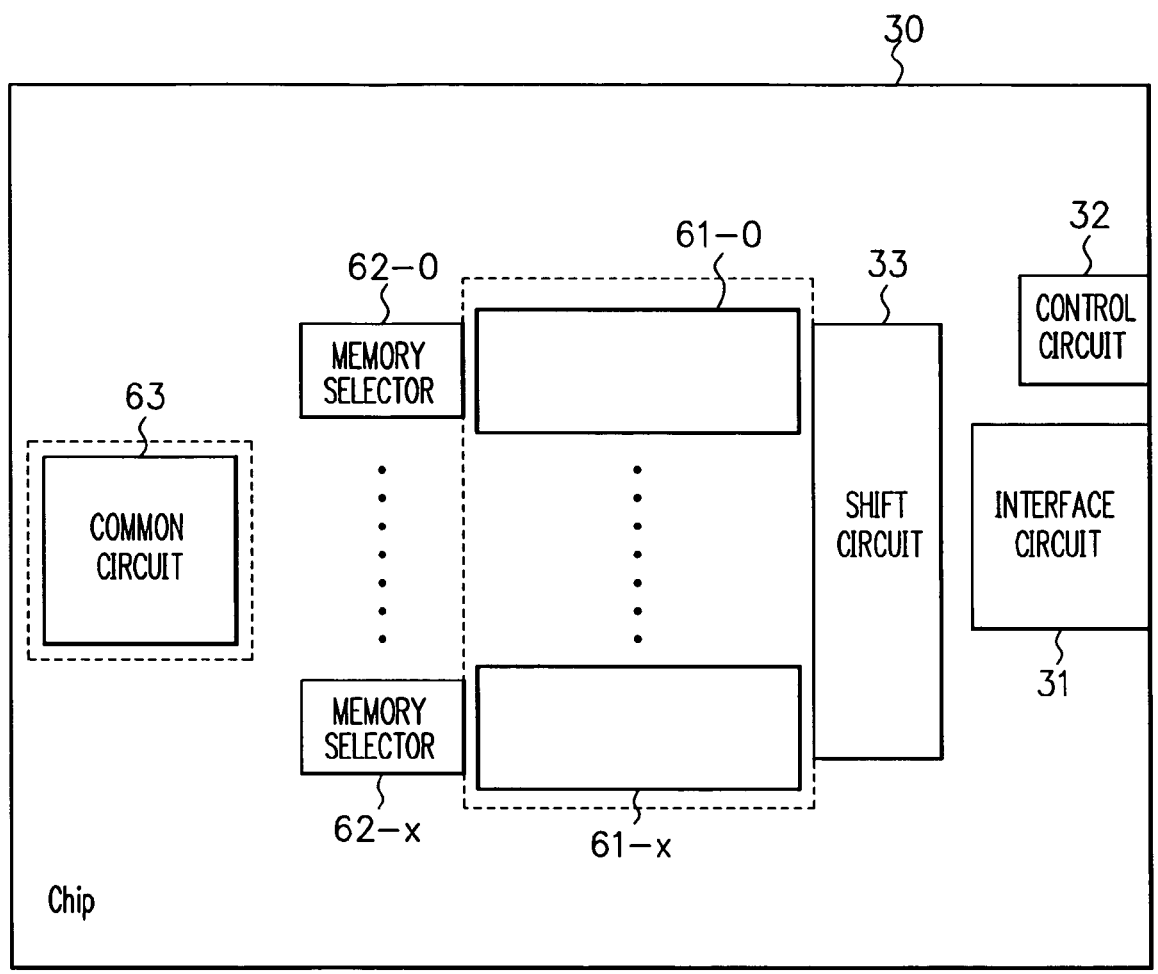
F I G. 8

SEMICONDUCTOR MEMORY DEVICE

CROSS-REFERENCE TO RELATED APPLICATIONS

This application is based upon and claims the benefit of priority from the prior Japanese Patent Application No. 2004-363259, filed on Dec. 15, 2004, the entire contents of which are incorporated herein by reference.

BACKGROUND OF THE INVENTION

1. Field of the Invention

The present invention relates to a semiconductor memory device in which non-volatile memory circuits are built in one chip.

2. Description of the Related Art

A micro-controller is configured to integrate an MPU (microprocessing unit), a RAM (random access memory), a ROM (read only memory), an IO (input/output circuit), an interface circuit and the like on one chip. The memory capacity of a non-volatile flash memory being one of such an integrated circuit is diverse from some kilobytes to several tens of megabytes, and the flash memory is generally comprised of a plurality of sectors, and the sector constitution is properly changed depending on a required memory capacity.

Therefore, in order -to reduce the man-hour of its development, for example, in case that a non-volatile memory having 1 MB memory capacity is required in one chip, in some cases, two memories having been developed up to 512 KB are built in one chip. Such being the case, in the case where two memories are built in one chip, at each of the memories, rewriting and reading operation can be executed individually. Especially, in connection with the rewriting, it is possible to continuously erase all the data in one memory by one command, and also it is possible to individually erase the data in the sector unit. Erase control technologies at a flash memory or an EEPROM being one kind of the non-volatile memory have been proposed in the following Patent Documents 1 and 2.

[Patent Document 1] Japanese Patent Application Laid-Open No. 2003-223792

[Patent Document 2] Japanese Patent Application Laid-Open No. HEI 5-12889

SUMMARY OF THE INVENTION

It is an object of the present invention to provide a semiconductor memory device, in which a plurality of non-volatile memory circuits are built in one chip and data erase operation for all of the plurality of non-volatile memory circuits can be continuously executed by only the same erase operation as in the case where a single non-volatile memory is built in one chip.

A semiconductor memory device according to the present invention comprises a continuous erase control circuit and a shift circuit. Based on a continuous erase start signal outputted, in response to an inputted continuous erase command, from the continuous erase control circuit, the shift circuit outputs a control signal for giving instructions to execute respective data erase operation to all of non-volatile memory circuits built in one chip sequentially, and when the data erase operation in all of the non-volatile memory circuits has been completed, the shift circuit outputs a continuous erase completion signal.

According to the above-mentioned constitution, based on one inputted continuous erase command, by the control of the shift circuit, the data erase operation in all of the non-volatile memory circuits built in one chip can be continuously executed sequentially.

BRIEF DESCRIPTION OF THE DRAWINGS

FIG. 1 is a diagram showing an example of a constitution of a flash memory comprised of one large capacity memory;

FIG. 2 is a diagram showing an example of a constitution of a semiconductor memory device according to an embodiment of the present invention;

FIG. 8 is a diagram showing an example of circuit disposition of a semiconductor memory device in which a plurality of flash memories are built in one chip;

DETAILED DESCRIPTION OF THE PREFERRED EMBODIMENTS

Figure 3:
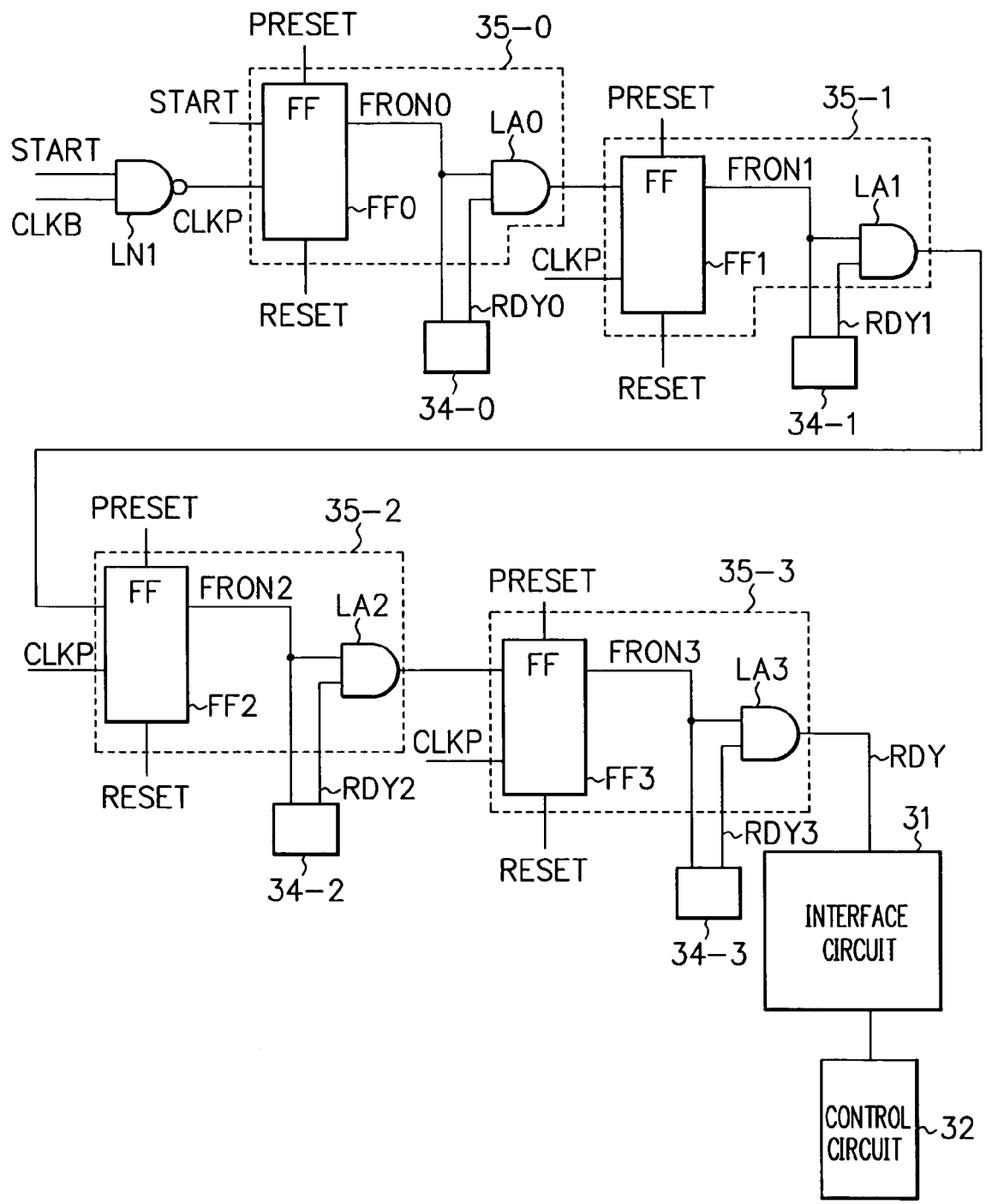
FIG. 3 is a circuit diagram showing a constitution of a shift circuit for continuous rewriting.

As mentioned above, at a semiconductor memory device in which a plurality of non-volatile memory circuits (memory macro) are built in one chip, it is possible to continuously erase all the data in one memory by only one command, and also it is possible that individual erase in the sector unit is executed. However, in case that, for example, simply, two non-volatile memory circuits are built in one chip, it has been impossible to continuously erase the data in these two memories by only one command. That is, in case that all of the data in a plurality of non-volatile memory circuits built in one chip are erased, it is necessary to issue a command one by one to each of the memories. Consequently, in case that a plurality of non-volatile memory circuits are built in one chip, it is necessary to issue the same number of commands as the number of built in memories, and at rewriting by using a writer, its evaluation and test become troublesome, resulting in inconvenience to users.

In addition, in case that a non-volatile memory circuit having a required memory capacity is to be developed by one memory, there is the following problem.

FIG. 1 is a diagram showing an example of a constitution of a non-volatile flash memory circuit (hereinafter, in some cases, simply referred to as a flash memory) 10 which has 1 MB memory capacity by one memory. The flash memory 10 is comprised of seven 64 KB sectors 11, one 32 KB sector 12, and two 16 KB sectors 13 per a vertical block. A Y selector 14 which selects a global bit line being the Y direction in the sector is provided in each of the vertical blocks, and an X decoder 15 which selects a word line being the X direction in the sector is provided between the vertical blocks.

Further, a data line DATAB which receives and sends data for each of the vertical blocks is provided, and the data line DATAB is connected to a sense amplifier 16 and a write amplifier 17. In addition, various voltage generating circuits, which supply predetermined voltages to the word line, the bit line and the like in response to each operation, are provided. That is, a voltage generating circuit for read word line 19, a voltage generating circuit for write bit line 20, a positive voltage generating circuit for word line/X and Y pass gates 21, an external high voltage switching circuit 22, a negative voltage generating circuit for erase word line 23 are provided. Moreover, a control circuit 24 which instructs to execute each operation by controlling each of the functional sections in the flash memory 10, and a test circuit 25 for testing are provided.

Here, for example, at the flash memory 10 having the sector constitution shown in FIG. 1, as shown in the diagram, the data line DATAB is configured to become common in different operation such as reading operation and rewriting operation. Therefore, at the time of the reading operation, the wiring and the gate load of the write amplifier 17 are applied to the path for data reading comprised of the data line DATAB and the sense amplifier 16.

In the data reading operation at the flash memory, the word line being the X direction of one sector is selected, and also, the data line DATAB is connected to a local bit line in the selected sector via the global bit line of the Y direction in accordance with the decoded result. Here, the global bit line is a main bit line provided between sectors.

Therefore, when the global bit line is long, at the time of the data reading operation, it takes long time to charge and discharge the global bit line, and the reading time is delayed. Further, when the number of memory cells connecting to the local bit line becomes large, that is, the sector capacity is large, the reading margin caused by column leakage of memory cells is deteriorated, as a result, a delay occurs in its reading time. Moreover, when the amount and the number of leakages are large, recovery by means of redundancy becomes impossible, resulting in a defective chip.

And also, at the word line, when the length thereof becomes long, there arises a delay in rise and/or fall time of the voltage at the word line due to the wiring load, thereby exerting adverse influence on the saturation time of the bit line, resulting in a delay in the reading operation. Further, when the sectors and the like are extended in the Y direction constitutionally, the total number of word lines increases and the load of supplying voltage onto the word line increases, resulting in a delay in the reading operation.

As it can be seen from the above, in the event of the smaller sector capacity and the smaller number of sectors in the vertical blocks, that is, the data line DATAB being the shorter, advantages are to be obtained in high speed data reading. However, when the data line DATAB is made short, the memory is specialized in a small capacity memory, so that there is no meeting the demand in the market in which a large capacity memory is needed. Consequently, it has been very difficult to realize a flash memory whose memory capacity is large and operation is executed in high speed (for example, random access read is possible in speed of 25 ns or less), by a simple method, without changing the cell structure and characteristics and corresponding peripheral circuits (the voltage generating circuits, the control circuit and the like).

In addition, each of such non-volatile memory circuits shown in FIG. 1 is provided with various voltage generating circuits for executing reading and rewriting data, the control circuit, and the test circuit. Especially, at the high voltage generating circuit, which is configured to use a charge pump, its circuit area (layout) is a large size, therefore, simply building a plurality of non-volatile memories in one chip causes the increase of the chip area.

A semiconductor memory device according to an embodiment of the present invention being explained below is one, in which although a plurality of non-volatile memories are built in one chip, data in all of the built in non-volatile memories can be continuously erased by only one command. Moreover, at the semiconductor memory device, without any change in cell structures and the characteristics and the like pertaining to peripheral circuits (voltage generating circuits, control circuits and the like), while any increase of a chip area being restrained, there is to be achieved increase in memory capacity as well as high speed operation.

Next, with reference to the drawings, an embodiment of the present invention will be explained.

FIG. 2 is a diagram showing an example of a constitution of a semiconductor memory device according to the embodiment of the present invention. In FIG. 2, as non-volatile memory circuits, flash memories are used, and as an example, a semiconductor memory device, in which four flash memories (flash memory macro) 34-$i$ (i is a suffix, and i=an integer being 0 to 3 and is the same in the following description) of 256 KB memory capacity are built in one chip 30, is shown. However, the present invention is not limited to this, and the number of non-volatile memory circuits to be built in one chip is arbitrary. Further, in FIG. 2, only a constitution, in which data of all of the flash memories 34-0 to 34-3 are continuously erased by only one command, is shown, however, needless to say, other constitutions may be properly used according to need.

As shown in FIG. 2, the semiconductor memory according to the present embodiment is provided with an interface circuit 31, a continuous erase control circuit 32, a shift circuit for continuous rewriting 33 and the four flash memories 34-$i$.

The interface circuit 31 receives and sends commands, addresses, data and the like from/to a CPU (central processing unit, not shown) and the like. The interface circuit 31 receives an issued command and returns a response according to the received command. In addition, the interface circuit 31 executes data reading and data rewriting for the flash memories 34-$i$, by supplying an address signal ADD for flash and by receiving and sending data DAT from/to the flash memories 34-$i$, in response to the received command.

The continuous erase control circuit 32 controls, based on a signal from the interface circuit 31, the shift circuit 33, and controls continuous erase operation of data in the flash memories 34-$i$. The continuous erase control circuit 32 supplies a reset signal RESET, a preset signal PRESET, and a continuous erase start signal START to the shift circuit 33. In addition, to the continuous erase control circuit 32, an erase signal ERASE_ALL is supplied from the interface circuit 31.

The shift circuit 33 has a function controlling a operation clock of the flash memories 34-$i$, in other words, a function controlling whether to operate the flash memories 34-$i$ or not, and has a group of holding circuits 35-$i$ which are arranged corresponding to each of the flash memories 34-$i$. To the shift circuit 33, as mentioned above, the reset signal RESET, the preset signal PRESET, and the continuous erase start signal START are supplied from the continuous erase control circuit 32, and also, a clock signal CLK is supplied. In addition, based on the control by the continuous erase control circuit 32, the shift circuit 33 supplies a clock control signal FRONi which controls the operation clock to the flash memories 34-*i*, and also to the shift circuit 33, a flag signal RDYi which signifies rewriting completion is supplied from the flash memories 34-*i*. Each of the flash memories 34-*i* has the memory capacity of 256 KB.

FIG. 3 is a circuit diagram showing an example of a constitution of the shift circuit for continuous rewriting 33. Here, in FIG. 3, for the sake of convenience of the explanation, the interface circuit 31, the continuous erase control circuit 32, and the flash memories 34-*i* are also shown. As shown in FIG. 3, the shift circuit for continuous rewriting 33 is comprised of four flip-flops FF0 to FF3 and four AND (logical product) circuits LA0 to LA3 in the combination of one flip flop FFi and one AND circuit LAi arranged corresponding to the flash memories 34-*i*, and one NAND circuit LN1. And by the respective combination of one flip flop FFi and one AND circuit LAi in which the value of the suffix "i" is the same, the above-mentioned group of holding circuits 35-*i* is configured.

To the NAND circuit LN1, the continuous erase start signal START and an inverted clock signal CLKB are inputted, and the NAND circuit LN1 outputs the operated result as a clock signal CLKP. This clock signal CLKP is supplied to the clock input of each of the flip-flop FF0 to FF3.

To the flip flop FF0, the continuous erase start signal START is inputted as a data input, and also the reset signal RESET and the preset signal PRESET are supplied. The flip-flop FF0 supplies a clock control signal FRON0 in response to these signals to the flash memory 34-0 and also to the AND circuit LA0.

To the AND circuit LA0, the clock control signal FRON0 from the flip-flop FF0 and a flag signal RDY0 which signifies rewriting completion from the flash memory 34-0 are inputted, and the AND circuit LA0 outputs the operated result.

To the flip-flop FFk (k=an integer being 1 to 3), the output from the AND circuit LA (k-1) is inputted as a data input, and also the reset signal RESET and the preset signal PRESET are supplied. The flip-flop FFk supplies a clock control signal FRONk in response to these signals to the flash memory 34-*k* and also to the AND circuit LAk. To the AND circuit LAk, the clock control signal FRONk from the flip-flop FFk and a flag signal RDYk which signifies rewriting completion from the flash memory 34-*k* are inputted, and the AND circuit LAk outputs the operated result.

The output from the AND circuit LA3 is supplied to the interface circuit 31, and when the interface circuit 31 detects the completion of the continuous erase operation of the flash memories 34-0 to 34-3 based on the output from the AND circuit LA3, the interface circuit 31 informs the control circuit 32 and the source that issued the continuous erase command about the completion.

Figure 4:
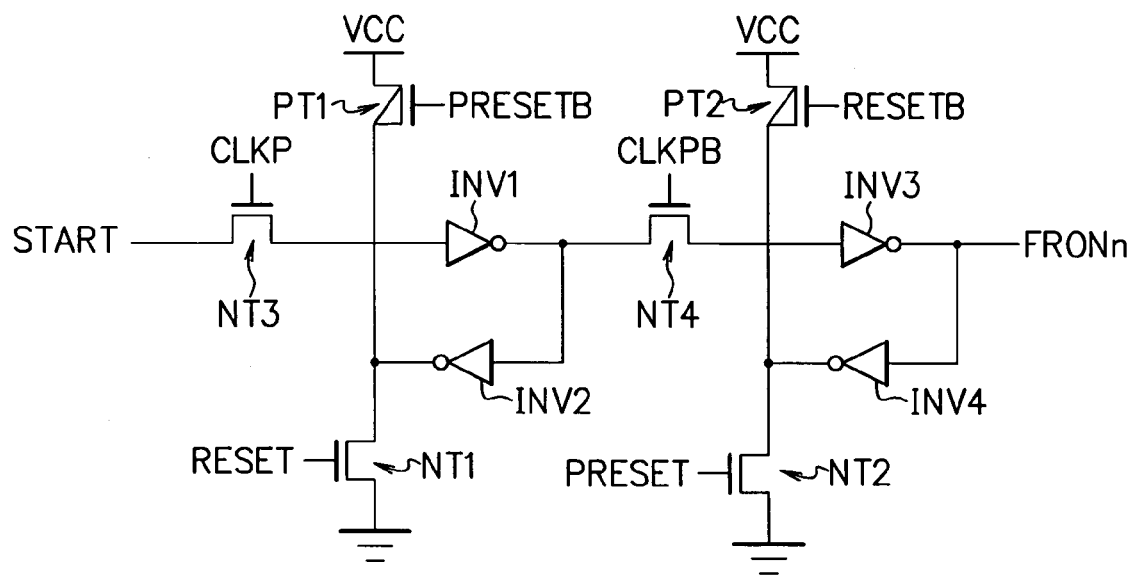
FIG. 4 is a circuit diagram showing a constitution of a flip-flop in the shift circuit for continuous rewriting.

FIG. 4 is a circuit diagram showing a constitution of the flip-flop FFi shown in FIG. 3. Here, in FIG. 4, the flip-flop FF0 is shown as an example, however, the flip-flop FFk (k=1 to 3) is configured similar to the flip-flop FF0, in a manner that the input signal (the continuous erase start signal START in the example shown in FIG. 4) is changed to the output signal from the AND circuit LA (k-1) and the output signal is changed to the FRONk.

The flip-flop FF0 is provided with four N-channel type transistors NT1 to NT4, two P-channel type transistors PT1 and PT2, and four inverters INV1 to INV4.

At the transistor PT1, an inverted preset signal PRESETB is supplied to its gate, and its source is connected to the power source voltage VCC. At the transistor NT1, the reset signal RESET is supplied to its gate, and its source is connected to the reference electric potential (for example, the ground level). The drain of the transistor PT1 and the drain of the transistor NT1 are connected.

Likewise, at the transistor PT2, the inverted reset signal RESETB is supplied to its gate, and its source is connected to the power source voltage VCC. At the transistor NT2, the preset signal PRESET is supplied to its gate, and its source is connected to the reference electric potential (for example, the ground level). The drain of the transistor PT2 and the drain of the transistor NT2 are connected.

In addition, the inverters INV1 and INV2 are configured as a latch in which one input terminal is connected to the other output terminal. Likewise, the inverters INV3 and INV4 are configured as a latch in which one input terminal is connected to the other output terminal.

And the input terminal of the inverter INV1 is connected to a mutual connection point of the drains of the transistors PT1 and NT1, and to the input terminal of the inverter INV1, the continuous erase start signal START is supplied via the transistor NT3 to whose gate the clock signal CLK is supplied. Likewise, the input terminal of the inverter INV3 is connected to a mutual connection point of the drains of the transistors PT2 and NT2, and to the input terminal of the inverter INV3, the output from the inverter INV1 is supplied via the transistor NT4 to whose gate the inverted clock signal CLKB is supplied. The output from the inverter INV3 is outputted as the clock control signal FRON0.

Next, continuous erase operation is explained.

First, in a state in which the continuous erase operation is not executed at the flash memories 34-0 to 34-3, that is, in a normal operation state except the continuous erase operation, the preset signal PRESET being outputted from the continuous erase control circuit 32 is a high level "H", and the reset signal RESET and the continuous erase start signal START are a low level "L".

In this state, when the interface circuit 31 received a continuous erase command issued from the not shown CPU and the like, the interface circuit 31 supplies the erase command ERASE_ALL to the continuous erase control circuit 32. The continuous erase control circuit 32 to which the erase command ERASE_ALL has been supplied changes the preset signal PRESET to "L", and after this, outputs the reset signal RESET which has been changed to "H" in a pulse shape to the shift circuit 33, and each flip-flop FFi in the shift circuit 33 is reset (initialized). By this operation, all of the output signals FRONi of the shift circuit 33 (in more detail, the output from each flip-flop FFi) become "L", and in all of the flash memories 34-*i*, the control clock which is generated (oscillated) therein is stopped. After this, the continuous erase control circuit 32 instructs the start of the execution of the continuous erase operation by changing the continuous erase start signal START to be supplied to the shift circuit 33 to "H".

Figure 5:
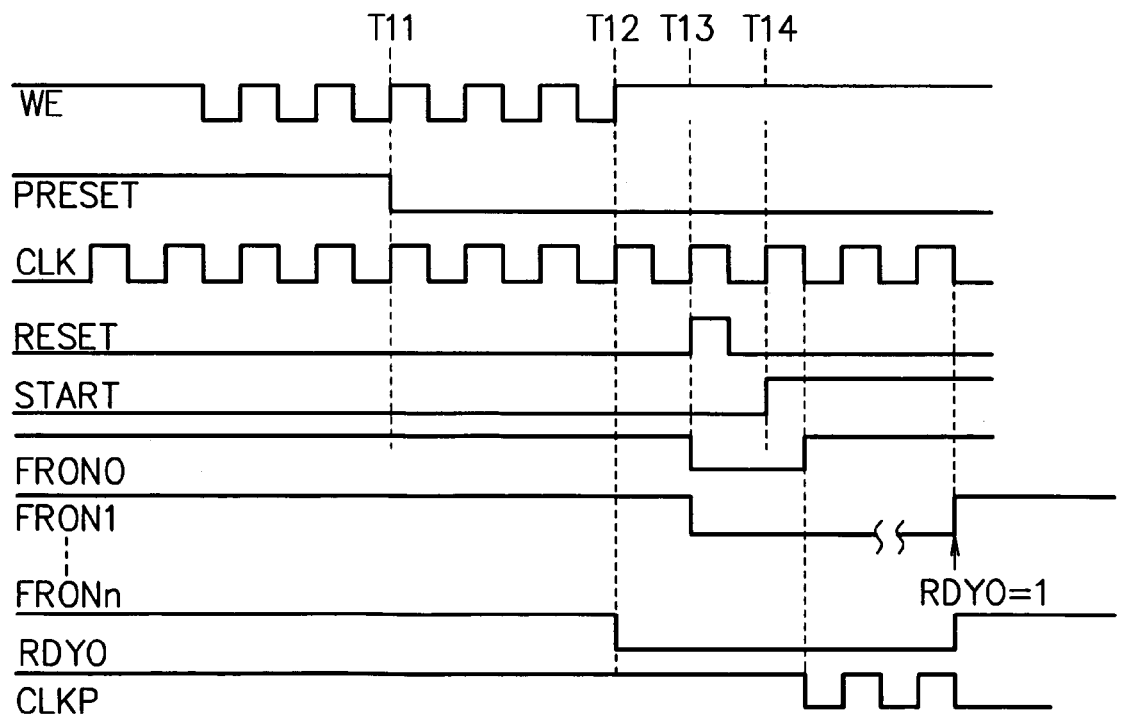
FIG. 5 is a timing chart showing process of a continuous erase control circuit at continuous erase operation.

Specifically, as shown in FIG. 5, the continuous erase control circuit 32 changes the preset signal PRESET to be supplied to the shift circuit 33 from "H" to "L" at the 3 clock time (the time T11) of the command input. Here, the period that a write enabling signal WE is "L" is the period that a command input is permitted. And when the command input ended at the time T12, at the rise time (the time T13) of the clock signal CLK being one clock after the time, the continuous erase control circuit 32 changes the reset signal RESET to be supplied to the shift circuit 33 to "H" in a pulse shape. Further, at the rise time (the time T14) of the clock signal CLK being one clock after the time, the continuous erase control circuit 32 changes the continuous erase start signal START to be supplied to the shift circuit 33 from "L" to "H". Here, before the time T14 when the continuous erase start signal START becomes "H", a command relating to data erase operation has been supplied to each of the flash memories 34-$i$ from the interface circuit 31 by using the address signal ADD for flash.

By the operation mentioned above, when the continuous erase start signal START became "H" (the preset signal PRESET and the reset signal RESET are "L"), first, the clock control signal FRON0, which is outputted from the flip-flop FF0 in the shift circuit 33 corresponding to the flash memory 34-0, became "H". By this, the control clock of the flash memory 34-0 is operated (oscillated), and data in the flash memory 34-0 is erased (rewritten). That is, erase operation in the flash memory 34-0 is started. Here, the clock control signals FRON1 to FRON3, which are respectively outputted from the other flip-flops FF1 to FF3 in the shift circuit 33, keep "L", and the control clocks of the flash memories 34-1 to 34-3 remain in the stop state. During this erase (rewriting)-operation, the flag signal RDY0, which signifies rewriting completion, outputted from the flash memory 34-0 is "L".

And when the erase (rewriting) operation at the flash memory 34-0 has been completed, the flash memory 34-0 changes the flag signal RDY0 to "H". As a result, both of the two inputs to the AND circuit LA0 become "H", and its output becomes "H". By this, the clock control signal FRON1, which is outputted from the flip-flop FF1 corresponding to the flash memory 34-1 becomes "H", the erase operation at the flash memory 34-1 is started, and the control clock of the flash memory 34-1 is operated (oscillated), and the data in the flash memory 34-1 is erased (rewritten).

And similar to the operation at the above-mentioned flash memory 34-0, when the erase (rewriting) operation at the flash memory 34-1 has been completed, the flash memory 34-1 changes the flag signal RDY1 to "H". As a result, both of the two inputs to the AND circuit LA1 become "H", and its output becomes "H".

After this, in the same way, the clock control signal FRON2, which is outputted from the flip-flop FF2 becomes "H", and the erase operation at the flash memory 34-2 in response to the clock control signal FRON2 is executed. After this completion, the clock control signal FRON3, which is outputted from the flip-flop FF3 becomes "H", due to the fact that the flag signal RDY2 became "H", and the erase operation at the flash memory 34-3 corresponding to this is executed.

And when the erase operation at the flash memory 34-3 has been completed, that is, a series of erase operation at all of the flash memories 34-0 to 34-3 has been completed, the flag signal RDY3 becomes "H". By this, the output from the AND circuit LA3 becomes "H". This output from the AND circuit LA3 is supplied to the interface circuit 31 as a continuous erase completion signal RDY. The interface circuit 31, which detected the completion of the continuous erase operation due to the fact that the continuous erase completion signal RDY has become "H", informs the continuous erase control circuit 32 about the completion of the continuous erase operation. The continuous erase control circuit 32, which received this information, changes the continuous erase start signal START to "L" and also changes the preset signal PRESET to "H". By the operation mentioned above, the continuous erase operation has been completed. Here, depending on necessity, the interface circuit 31 may inform the source that issued the erase command about the completion of the continuous erase operation.

As mentioned above, when the interface circuit 31 received the continuous erase command which continuously erases data in the plurality of flash memories 34-$i$ built in one chip 30, in response to the continuous erase command, the start of the execution of the continuous erase operation is instructed from the continuous erase control circuit 32 to the shift circuit 33. And based on the control of the shift circuit 33, data erase operation in the flash memories 34-$i$ is continuously executed sequentially, and when the data erase operation at all of the flash memories 34-$i$ has been completed, the continuous erase completion signal RDY is supplied from the shift circuit 33 to the interface circuit 31. By this, the data erase operation in the plurality of flash memories 34-$i$ built in the chip 30 can be continuously executed by one continuous erase command, and by only once operation which is the same in the case that a single non-volatile memory circuit is built in, the data erase operation in all of the flash memories 34-$i$ built in the chip 30 can be executed.

Here, the above-mentioned continuous erase does not depend on the constitution of memories built in a chip, and can be applied to an arbitrary memory constitution. Recently, a dual operation type flash memory being a plural bank constitution has been proposed, and this continuous erase can be applied to a memory having such a constitution.

Figure 6:
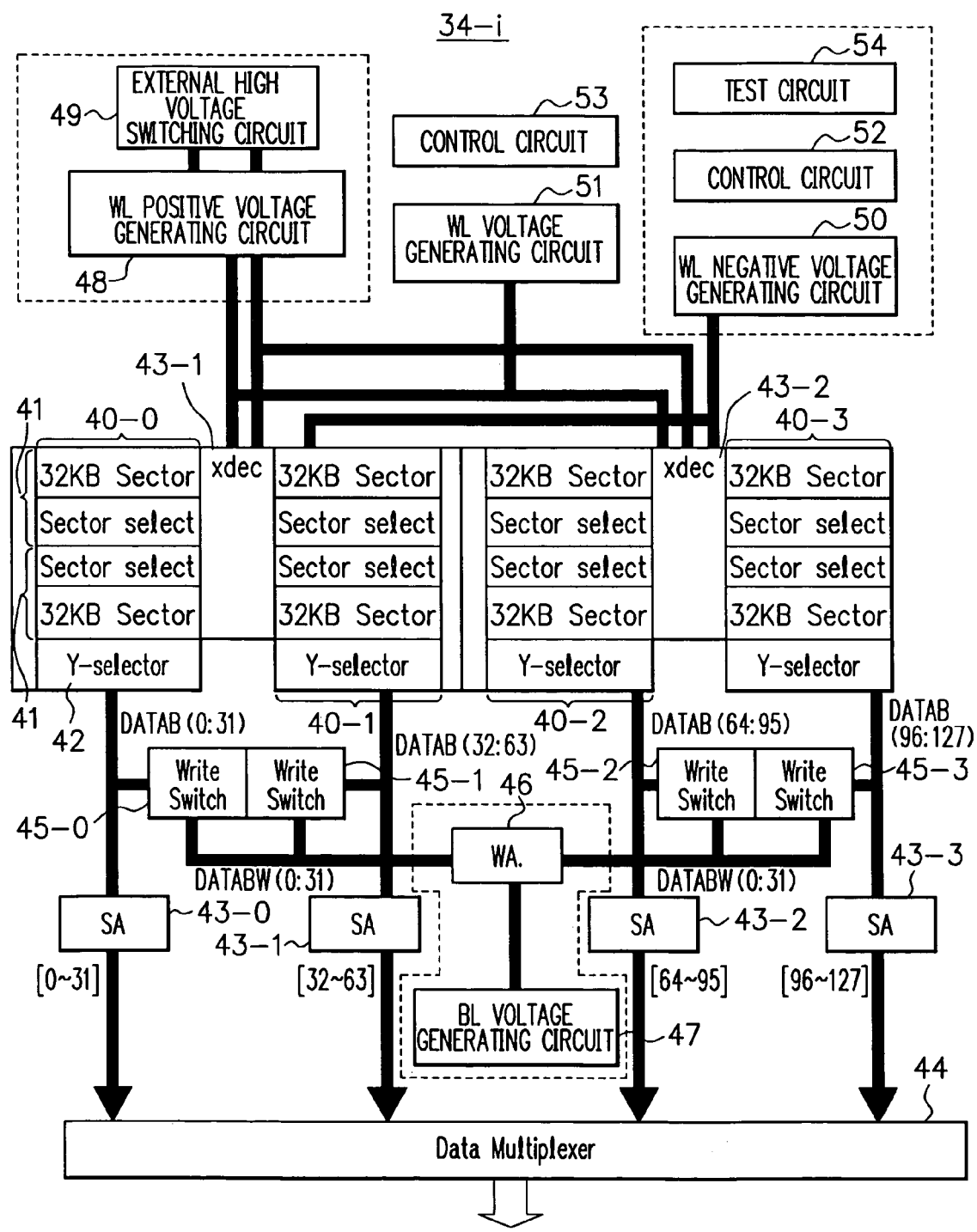
FIG. 6 is a diagram showing a basic constitution of a flash memory according to the present embodiment.

FIG. 6 is a diagram showing a basic constitution of the flash memory 34-$i$ built in the chip 30 at the semiconductor memory device according to the present embodiment shown in FIG. 2, and shows one flash memory (flash memory macro) having memory capacity of 256 KB.

The flash memory 34-$i$ is provided with four vertical blocks 40-$j$ (j is a suffix, and j=an integer being 0 to 3 and is the same in the following description) and one vertical block 40-$j$ is provided with two 32 KB sectors 41. In each of the vertical blocks 40-$j$, a Y selector 42 is disposed, and an X decoder 43-1 is provided for the vertical blocks 40-0 and 40-1, and an X decoder 43-2 is provided for the vertical blocks 40-2 and 40-3. The Y selector 42 selects a global bit line GBL being located in the Y direction in the sector, the X decoders 43-1 and 43-2 select a word line WL being located in the X direction in the sectors.

Figure 7:
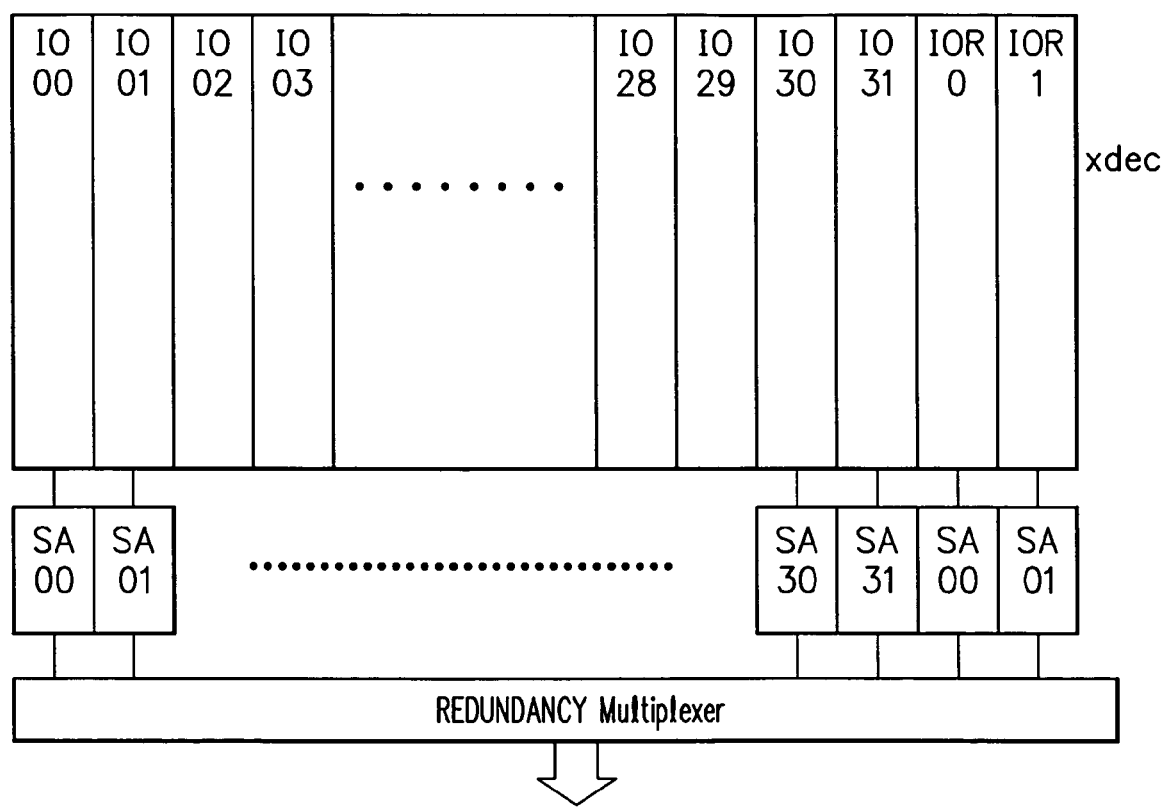
FIG. 7 is a diagram showing a column constitution.

FIG. 7 is a diagram showing a column constitution (disposition) in each of the vertical blocks 40-$j$, and at the present embodiment, 32 IOs (IO0 to IO31) connecting to memory cells being not for redundancy and two IOs (IOR0 and IOR1) for redundancy are provided. Further, two elements of IO blocks for redundancy are arranged in a pair state so as to adjoin both sides of the X decoders 43-1 and 43-2, which correspond in the vertical blocks 40-$j$, thereby, the load for the word line WL for redundancy reading does not become the worst state. Here, the bit line for redundancy, similar to the bit line relating to memory cells for not redundancy, corresponds to a sense amplifier mentioning later in a one to one state. Here, this is not limited to the IO redundancy shown in FIG. 7, and can be applied to address redundancy.

Again, in FIG. 6, in the unit of the vertical blocks 40-$j$, data line DATAB$n$ (n is an integer being 0 to 127, and as shown in the diagram, 32 lines, that is, 32 bit width for each of the vertical blocks 40-$j$) being common for the plural sectors are connected to a group of sense amplifiers 43-$j$. Each of the group of sense amplifiers 43-$j$ is provided with 32 sense amplifiers, and one data line DATAB$n$ being different from each other is connected to each sense amplifier. And also, the outputs from the group of sense amplifiers 43-$j$ are supplied to a data multiplexer 44 via data lines DATA$n$ (likewise, the data line DATA is 32 bit width for each of the group of sense amplifiers 43-*j*). The data multiplexer 44 selectively supplies the outputs from each group of sense amplifiers 43-*j* supplied via the data lines DATAn to the interface circuit 31 by the maximum parallel 64 bits.

A write switch 45-*j* is a switching circuit that separates the data lines DATAB (32*j* to 32*j*+31) from data lines for rewriting DATAWm (m is an integer being 0 to 31). That is, in the flash memory 34-*i* at the present embodiment, the data lines for data reading DATAB (32*j* to 32*j*+31) and the data lines for rewriting DATAWm can be separated, therefore, the wiring for the data lines for data reading DATAB can be reduced, and also the load can be reduced. The data lines for rewriting DATAWm are connected to a group of write amplifiers 46. The same as the group of sense amplifiers 43-*j*, the group of write amplifiers 46 is provided with 32 write amplifiers, and one data line DATAWm being different from each other is connected to each write amplifier.

And the reference numeral 47 is a voltage generating circuit for rewrite bit line, which generates a voltage supplying to bit lines (global bit line GBL and local bit line LBL) at the time when data to be memorized in a memory cell is rewritten. The reference numeral 48 is a positive voltage generating circuit for word line/X and Y pass gates, which generates positive voltages supplying to the word line WL and the X and Y pass gates, and the reference numeral 49 is an external high voltage switching circuit, which controls the supply of an external high voltage to the word line/X and Y pass gate positive voltage generating circuit 48. The reference numeral 50 is a negative voltage generating circuit for erase word line, which generates a negative voltage supplying to the word line WL at the time when data being memorized in the memory cell is erased, and the reference numeral 51 is a voltage generating circuit for read word line, which generates a voltage supplying to the word line WL at the time when data is read from the memory cell.

The reference numeral 52 is a first control circuit, which instructs to execute various kinds of operation by controlling each of functional sections in the flash memory. However, a second control circuit 53 has for its functions the outputting of a ready signal and a busy signal (the ready signal and the busy signal can be signals in respective individual signal lines or can be signals in one signal line in which a ready state or a busy state is decided depending on the logic level) in the flash memory 34-*i*. Here, in the ready signal, the continuous erase completion signal RDY in the above-mentioned continuous erase operation is included, and this continuous erase completion signal RDY is outputted from the second control circuit 53. The reference numeral 54 is a test circuit that executes a test function and the like.

Here, at the flash memory 34-*i* according to the present embodiment, the word line voltage generating circuit 51 that is indispensable for the reading operation, the X decoders 43-1 and 43-2, and the Y selector 42-*j* are disposed around the memory cell array such that the wiring load may be minimized. By this, increasing the wiring load is restrained and high speed operation can be achieved.

In addition, in the flash memory 34-*i*, memory cell sections (the memory cell array, the X decoder, and Y selector), peripheral circuits for reading (the group of sense amplifiers 43-*j*, the word line voltage generating circuit 51 that is indispensable for the reading operation, and the data multiplexer 44), the write switch 45-*j*, and the second control circuit 53 are provided in each flash memory 34-*i*. On the other hand, for the sake of convenience of the explanation, those are shown in FIG. 6, peripheral circuits for rewriting and the like being different from the peripheral circuits for reading (in FIG. 6, those surrounded by broken line frames, the group of write amplifiers 46, the bit line voltage generating circuit 47, the word line/X and Y pass gate positive voltage generating circuit 48, the external high voltage switching circuit 49, the negative voltage generating circuit for erase word line 50, the first control circuit 52 and the test circuit 54) are arranged so as to be used in common at the plurality of flash memories 34-*i*, without any arrangement for each flash memory 34-*i* as shown in FIG. 8. That is, the flash memory 34-*i* in the present embodiment has a circuit constitution specialized in the reading operation, and the circuits for using the rewriting operation and the like are provided as the common circuits for the plurality of flash memories 34-*i*. Here, the peripheral circuits for rewriting and the like being different from the peripheral circuits for reading may be used in common at all of the flash memories 34-*i*.

FIG. 8 is a diagram showing an example of circuit disposition of a semiconductor memory device in which a plurality of flash memories are built in one chip according to the present embodiment.

In FIG. 8, the interface circuit 31, the continuous erase control circuit 32, and the shift circuit for continuous rewriting 33 are the same as those shown in FIG. 2, therefore, the same explanation is omitted. The reference numerals 61-0 to 61-*x* (x is an arbitrary natural number) are flash memories comprised of peripheral circuits for reading whose circuits are respectively constituted in such a manner as to specialize in reading operation and the memory cell sections (the memory cell array, the X decoder, and Y selector), that is, are the flash memories which are configured to exclude the peripheral circuits surrounded by the broken line frames in FIG. 6. The reference numerals 62-0 to 62-*x* are memory selectors which are arranged corresponding to the flash memories 61-0 to 61-*x* so as to select a desired flash memory. The reference numeral 63 is a common circuit which is used by the plurality of flash memories 61-0 to 61-*x* in common. This common circuit 63 includes at least one of peripheral circuits for rewriting and peripheral circuits for erase being different from peripheral circuits for reading, and is the peripheral circuits surrounded by the broken line frames in FIG. 6.

As mentioned above, the flash memory is comprised of the memory cell sections and the peripheral circuits for reading, and other peripheral circuits except for the memory cell sections and the peripheral circuits for reading are shared by the plurality of flash memories as the common circuit, therefore, even when a plurality of flash memories are built in one chip, increasing the chip area can be restrained. Especially, as mentioned above, the circuit size of the high voltage generating circuit using a charge pump generally becomes large, therefore, any increase of the chip area can be restrained by properly sharing those circuits. Here, the constitution, in which the flash memory is comprised of the memory cell sections and the peripheral circuits for reading and other peripheral circuits except for the memory cell sections and the peripheral circuits for reading are shared by the plurality of flash memories as the common circuit, is not limited to the semiconductor memory device being capable of continuous erase operation according to the present embodiment, this constitution can be applied to an arbitrary semiconductor memory device in which a plurality of non-volatile memory circuits are built in one chip.

Figure 9:
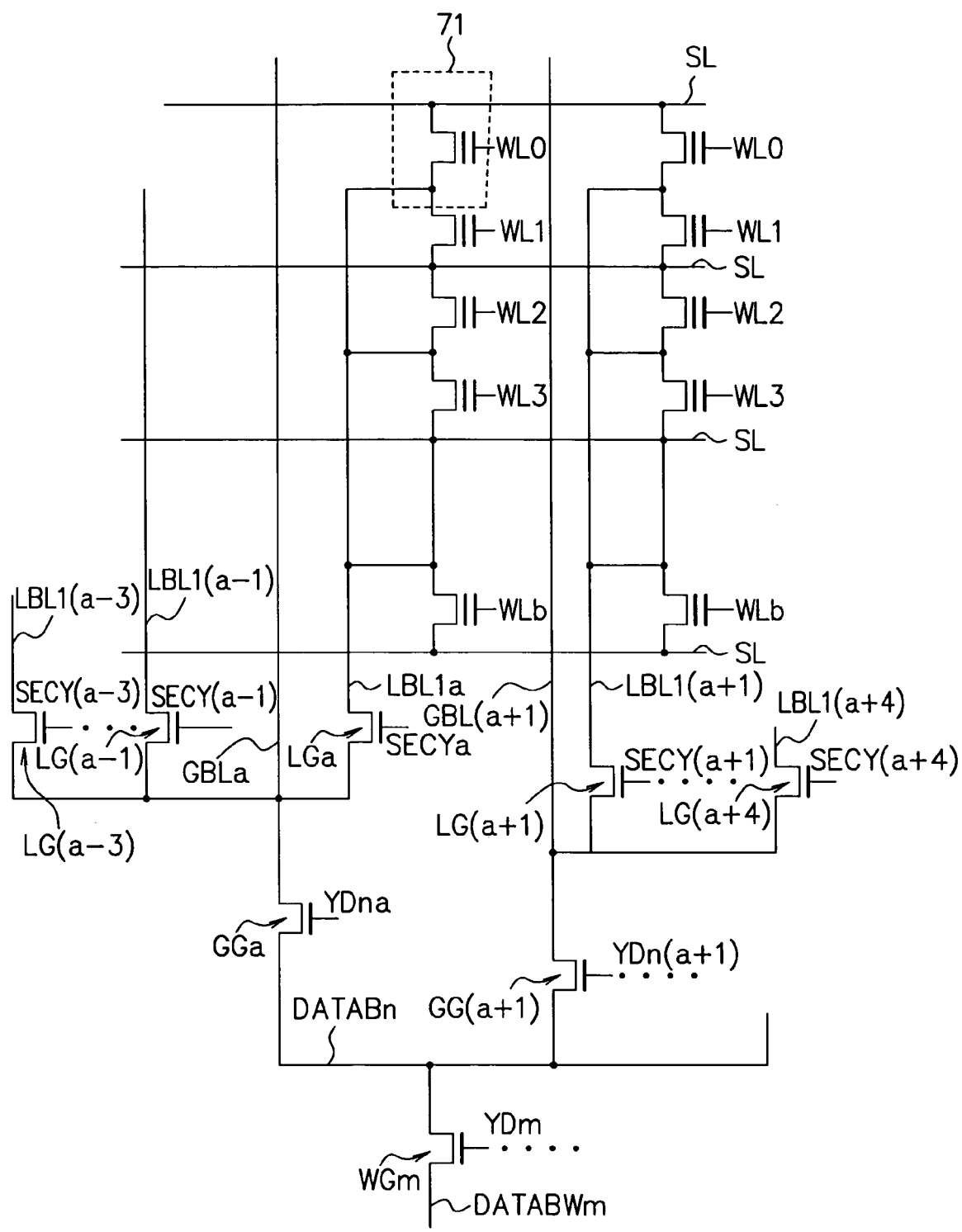
FIG. 9 is a diagram showing an outline of an example of a constitution of a memory cell array of which each sector is comprised.

FIG. 9 is a diagram showing an outline of an example of a constitution of a memory cell array of which each sector is comprised.

In FIG. 9, the reference numeral 71 denotes a memory cell and is comprised of a transistor having a floating gate. And a threshold voltage of the transistor is controlled by executing the injection or extraction of electrons for the floating gate, and storing data is realized. Here, the detailed constitution of the memory cell is the same as that at the memory cell in the existing non-volatile memory, therefore; its explanation is omitted.

As shown in FIG. 9, at the transistor constituting each memory cell 71, the source is connected to a source (power source) line SL, the drain is connected to a corresponding local bit line LBL1$y$ (y is a suffix). And the control gate is connected to a word line WL0, WL1, . . . , WLb.

The local bit line LBL1$a$ is connected to a corresponding global bit line GBLa via the gate LGa of a transistor to whose gate a signal SECYa is supplied. Likewise, each local bit line LBL1$y$ is connected to a corresponding global bit line GBLa, GBL (a+1), . . . , via the gate LGy of a transistor to whose gate a signal SECYy is supplied. Here, as shown in FIG. 9, for example, like local bit lines LBL1 (a-3), . . . , LBL (a-1), and LBL1$a$ are connected to the global bit line GBLa, at the present embodiment, four local bit lines LBL1$y$ are connected to each of the global bit lines GBLa, GBL (a+1), Here, each local bit line LBL1$y$ is a bit line in each sector and is not connected extending over a plurality of sectors, whereas on the contrary, the global bit lines GBLa, GBL (a+1), . . . are bit lines that are connected extending over the plurality of sectors. And in FIG. 9, only the memory cell 71 connected to the local bit lines LBL1$a$ and LBL1 (a+1) is shown, however, needless to say, likewise, a memory cell 71 is connected to each local bit line LBL1$y$.

As mentioned above, each of the global bit lines GBLa, GBL (a+1), . . . to which the plurality of local bit lines LBL1$y$ (four, at the present embodiment) are connected via the gates LGy of transistors, is connected to a data line DATABn via the gate GGa, GG (a+1), . . . of each transistor to whose gate each signal YDna, YDn (a+1), . . . is supplied. As mentioned above, the data line DATABn is connected to the sense amplifier in the group of sense amplifiers 43-$j$. In addition, the data line DATAWm whose one end is connected to the write amplifier in the group of write amplifiers 46 is connected to the data line DATABn via the gate WGm (corresponds to the write switch 45-$j$) of a transistor to whose gate a signal YDm is supplied.

Figure 10A:
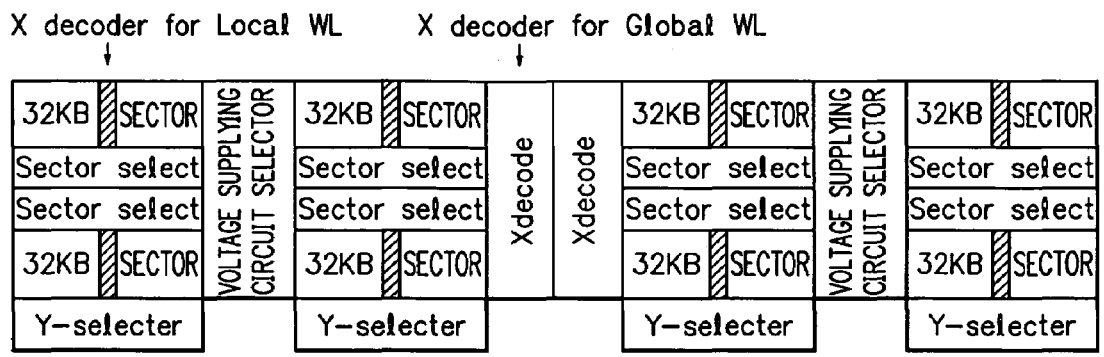
FIGS. 10A to 10C are diagrams showing other examples of constitutions of decoders according to the present embodiment.
Figure 10B:
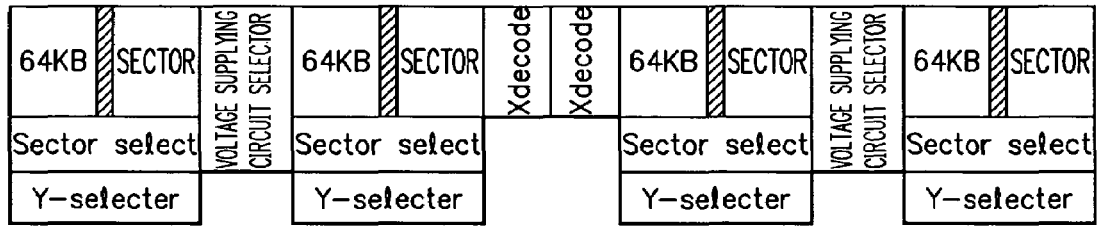
Figure 10C:
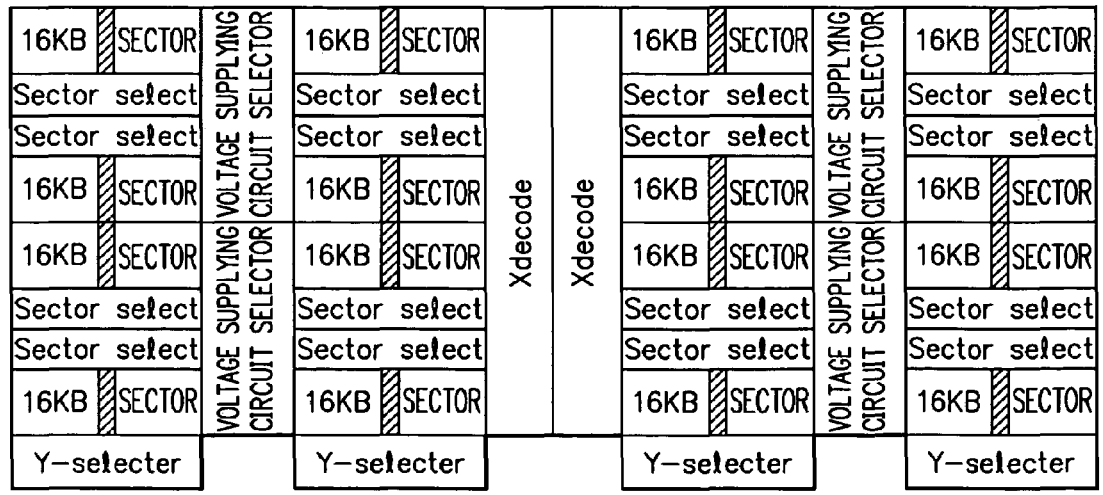

Here, at the flash memory according to the present embodiment, the disposition of the X decoders is not limited to that shown in FIG. 6, as examples, constitutions shown in FIGS. 10A to 10C may be used. Even in the event of implementing the constitutions shown in FIGS. 10A to 10C, there might be realized the functions being the same as the above-mentioned word line WL by the global word line GWL and the local word line LWL and the IO blocks for redundancy are disposed so as to adjoin both sides of the X decoders for the local word line LWL, so that the margin for reading operation could be the same as that at the above-mentioned embodiment and there could be no difference. For example, the constitutions shown in FIGS. 10A to 10C are effective in case that the vertical blocks are caused to be increased in the X direction.

As explained above, according to the present embodiment, the following effects can be obtained.

(1) In response to the continuous erase command received at the interface circuit 31, the start of the execution of the continuous erase operation is instructed from the continuous erase control circuit 32 to the shift circuit 33, and the data erase operation in the flash memories 34-$i$ is continuously executed sequentially by the shift circuit 33, and when the data erase operation in all of the flash memories 34-$i$ has been completed, the continuous erase completion signal RDY is supplied from the shift circuit 33 to the interface circuit 31. By this, the data erase operation in the plurality of flash memories 34-$i$ built in the chip 30 can be continuously executed by one continuous erase command, and by one operation as is also the case where a single non-volatile memory circuit is built in, the data erase operation in all of the flash memories 34-$i$ built in the chip 30 can be executed.

(2) Not by a single flash memory, but by division into a plurality of flash memories built in one chip, loads caused by wiring and gates can be reduced, and the time constant of the global bit line can be improved, further, the delay in data reading can be avoided. In addition, due to the fact that the data line for reading DATABn and the data line for rewriting DATAWm are connected via a switch, the data line for reading DATABn and the data line for rewriting DATAWm can be separated, and the same effect can be obtained.

(3) The memory cell sections and the peripheral circuits for reading are disposed in each flash memory, and the other peripheral circuits associated with the flash memories are shared as a common circuit by the plurality of flash memories, thereby, even when a plurality of flash memories are built in one chip, increasing the chip area can be restrained.

Moreover, due to the fact that not a single flash memory, but a plurality of flash memories are built in one chip, the man-hour in the development can be reduced, and also by a simple method, in which the cell constitution and the characteristics of the peripheral circuits (the voltage generating circuits, the control circuits and the like) are not changed, a large capacity of memories and high speed operation can be realized.

Here, in case that a plurality of small sectors (less than 64 KB) are provided in the vertical block unit for high speed reading, one problem is that rewriting time is increased, but by erasing the plural sectors together, this problem can be avoided. Further, by a sector selection circuit provided in the sector unit, the Y direction (global bit line) becomes long physically, however, as shown in FIG. 6, the sector select is disposed on only one side, whereby, the increase can be made small, further, there is an advantage that a symmetric BL (bit line) system can be introduced. Here, reading by the symmetric BL system is known; therefore, the explanation is omitted.

In addition, in the above-mentioned present embodiment, the reason why the number of IOs is 32 is as follows. In case that one chip is realized with a 32 bits CPU, there is no waste in reading operation and the operation becomes effective. Further, at the time of 64 bit reading, the X decoder is common at the time of 32 bit reading, and increase in the current consumption can be prevented, and when data in which 64 bits have been read at the same time are outputted in every 32 bit, a pseudo burst function can be realized and high speed operation can be facilitated.

Here, the above-mentioned present embodiment shows only an example that executes the present invention, and the art of the present invention is not to be restricted by the embodiment. That is, the present invention can be executed in various ways without departing from the technical spirit or the main features of the present invention.

According to the present invention, based on a continuous erase start signal outputted in response to an inputted continuous erase command, a control signal for giving instructions to execute respective data erase operation is outputted to all of non-volatile memory circuits built in one chip sequentially, and when the data erase operation in all of the non-volatile memory circuits has been completed, a continuous erase completion signal is outputted. Thereby, based on only one continuous erase command, the data erase operation in all of the non-volatile memory circuits built in one chip are executed sequentially, and by only one operation being the same as in the case where a single non-volitile memory circuit is built in, the data erase operation in all of the non-volatile memory circuits can be continuously executed. In addition, due to the fact that not a single flash memory, but a plurality of non-volatile memory circuits are built in one chip, loads caused by wiring and gates are reduced and the time constants associated with charging and discharging of the signal lines and the rise and fall of voltage become small, and the delay in the reading operation can be avoided.

What is claimed is:

1. A semiconductor memory device, comprising:
    a plurality of non-volatile memory circuits in one chip, each of the non-volatile memory circuits executing a data erase operation in response to receiving a control signal to execute the data erase operation, and after the data erase operation has completed, outputting a local completion signal distinct from the control signal;
    a continuous erase control circuit outputting a continuous erase start signal in response to an inputted continuous erase command; and
    a shift circuit outputting the control signal to a first one of the plurality of non-volatile memory circuits and receiving from the first one of the plurality of non-volatile memory circuits the local completion signal, and then outputting the control signal to the rest of the plurality of non-volatile memory circuits sequentially upon receiving the local completion signal from the preceding non-volatile memory circuit, and outputting a continuous erase completion signal upon receiving the local completion signal from the last of the plurality of non-volatile memory circuits, based on the continuous erase start signal outputted from the continuous erase control circuit.

2. The semiconductor memory device according to claim 1, wherein the shift circuit comprises a plurality of holding circuits connected in cascade, each of which is respectively disposed in association with one of the non-volatile memory circuits, and
    the holding circuit outputs the control signal to a corresponding non-volatile memory circuit, and supplies the signal indicative of completion of the data erase operation from the corresponding non-volatile memory circuit to the holding circuit connected to the succeeding stage.

3. The semiconductor memory device according to claim 2, wherein the holding circuit comprises:
    a flip-flop which outputs the control signal; and
    a logical operation circuit to which the control signal and the signal indicative of completion of the data erase operation from the corresponding non-volatile memory circuit are inputted, and whose output is supplied to a flip-flop of the holding circuit connected to the succeeding stage.

4. The semiconductor memory device according to claim 1, wherein the control signal is a signal to control as to whether the non-volatile memory circuit is put into operation or not.

5. The semiconductor memory device according to claim 1, wherein the control signal is a signal for effecting control of oscillation of an operation clock signal generated in the non-volatile memory circuits.

6. The semiconductor memory device according to claim 1, further comprising:
    an interface circuit receiving an inputted command,
    wherein the interface circuit gives, to the continuous erase control circuit, instructions for outputting the continuous erase start signal based on the inputted continuous erase command, and stops the operation of the continuous erase control circuit based on the continuous erase completion signal from the shift circuit.

7. The semiconductor memory device according to claim 1, wherein each of the non-volatile memory circuits is comprised of a memory cell section relating to storing data and a peripheral circuit for reading relating to an operation of data reading from the memory cell section.

8. The semiconductor memory device according to claim 7, wherein the peripheral circuit for reading is disposed near the memory cell section.

9. The semiconductor memory device according to claim 7, wherein a peripheral circuit other than the memory cell section and the peripheral circuit for reading in each of the non-volatile memory circuit is disposed as a common circuit which is used in common by the plurality of non-volatile memory circuits.

10. The semiconductor memory device according to claim 9, wherein the common circuit includes at least one of a peripheral circuit for rewriting relating to data rewriting operation and a peripheral circuit for erasing relating to data erase operation for the memory cell sections.

11. The semiconductor memory device according to claim 7, wherein the memory cell section and the peripheral circuit for reading, comprising:
    a memory cell array having a plurality of bit lines and a plurality of word lines, and having memory cells for storing data are disposed at each of the interconnections of the bit lines and the word lines respectively;
    a bit line decoder selecting a bit line;
    a word line decoder selecting a word line;
    a voltage generating circuit generating a voltage supplying to the word lines in the case to read data from the memory cells; and
    a sense amplifier circuit amplifying data read from the memory cells.

12. The semiconductor memory device according to claim 7, wherein a signal path for executing data rewriting in the memory cell section and a signal path for executing data reading from the memory cell section are able to be separated in the non-volatile memory circuits.

13. The semiconductor memory device according to claim 7, wherein a signal path for executing data rewriting in the memory cell section and a signal path for executing data reading from the memory cell section are connected via a switching circuit.

* * * * *